(12) United States Patent
Hasegawa

(10) Patent No.: US 6,889,102 B2
(45) Date of Patent: May 3, 2005

(54) APPARATUS AND A METHOD FOR COLLECTION OF A PROBLEM PART

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 612 days.

(21) Appl. No.: 09/808,131

(22) Filed: Mar. 15, 2001

(65) Prior Publication Data

US 2002/0019676 A1 Feb. 14, 2002

(30) Foreign Application Priority Data

Mar. 17, 2000 (JP) ........................................ 2000-075829

(51) Int. Cl.[7] .............................................. G06F 19/00
(52) U.S. Cl. ................................ 700/97; 700/98; 703/1
(58) Field of Search ............................ 700/97–98, 103, 700/182; 716/5; 703/7, 1

(56) References Cited

U.S. PATENT DOCUMENTS

| | | | | |
|---|---|---|---|---|
| 5,383,132 A | * | 1/1995 | Shinohara et al. | 716/5 |
| 5,418,728 A | * | 5/1995 | Yada | 700/97 |
| 5,586,052 A | * | 12/1996 | Iannuzzi et al. | 703/1 |
| 5,687,094 A | * | 11/1997 | Kagawa et al. | 716/5 |
| 5,844,563 A | * | 12/1998 | Harada et al. | 345/420 |
| 6,223,092 B1 | * | 4/2001 | Miyakawa et al. | 700/103 |
| 6,385,765 B1 | * | 5/2002 | Cleaveland et al. | 717/100 |
| 6,418,551 B1 | * | 7/2002 | McKay et al. | 716/5 |

FOREIGN PATENT DOCUMENTS

JP          8-22480          1/1996

* cited by examiner

Primary Examiner—Leo Picard
Assistant Examiner—Alexander Kosowski
(74) Attorney, Agent, or Firm—McGinn & Gibb, PLLC

(57) ABSTRACT

A bug collection apparatus for use when a design modification is made to a bug in a drawing designed by using a computer aided design system, the apparatus formed by a first means for detecting whether the modification to the bug exceeds a pre-established criterion, and a second means for collecting and recording a bug information corresponding to the modification when the first means detecting that the modification exceeds the pre-established criterion.

36 Claims, 2 Drawing Sheets

APPARATUS AND A METHOD FOR COLLECTION OF A PROBLEM PART

BACKGROUND OF THE INVENTION

1. Field of the Invention

The present invention relates to an apparatus and a method for collection of a problem part. More particularly, it relates to an apparatus and a method for collection of a problem part, which enable efficient collection of a problem part when a design modification is made to a problem part in a design drawing by using a CAD system.

2. Related Art

In the past, collection of problem parts in a design of a product was performed manually. However, in the method of the prior art, there were the problems of missing an important modification information and not being able to collect and process data accurately.

Accordingly, it is an object of the present invention, in order to improve the drawbacks of the prior art as noted above, to provide a novel apparatus for the collection of a problem part, and a method therefor, which, when a designer makes a design modification, automatically detects a problem part and automatically collects a problem part, without human intervention.

SUMMARY OF THE INVENTION

In order achieve the above-noted objects, the present invention adapts the following basic technical constitution.

A first aspect of an apparatus according to the present invention is a bug collection apparatus for use when a design modification is made to a bug in a drawing designed by using a computer aided design system, the apparatus comprising: a first means for detecting whether the modification to the bug exceeds a pre-established criterion, and a second means for collecting and recording a bug information corresponding to the modification when the first means detecting that the modification exceeds the pre-established criterion.

In the second aspect of an apparatus according to the present invention, the first means and the second means are provided separately from one another, the bug collection apparatus further comprising a third means for sending the bug information from the first means to the second means.

A first aspect of a method of the present invention is a method for a bug collection for use when a design modification is made to a bug in a drawing designed by using a computer aided design system, the method comprising the steps of: detecting whether or not the modification to the bug exceeds a pre-established criterion, and collecting a bug information corresponding to the modification when an information including the modification exceeding the pre-established criterion is detected in the detecting step.

A second aspect of a method of the present invention is a method for a bug collection for use when a design modification is made to a bug in a drawing designed by using a computer aided design system, the method comprising the steps of: detecting whether or not the modification to the bug exceeds a pre-established criterion, sending a bug information corresponding to the modification to a collecting means, which is provided separately from a detecting means, for collecting and recording the bug information, when an information including the modification exceeding the pre-established criterion is detected in the detecting step, and collecting and recording the bug information to the collecting means.

DETAILED DESCRIPTION OF THE PREFERRED EMBODIMENTS

Embodiments of the present invention are described in detailed below, with references made to relevant accompanying drawings.

Figure 1:
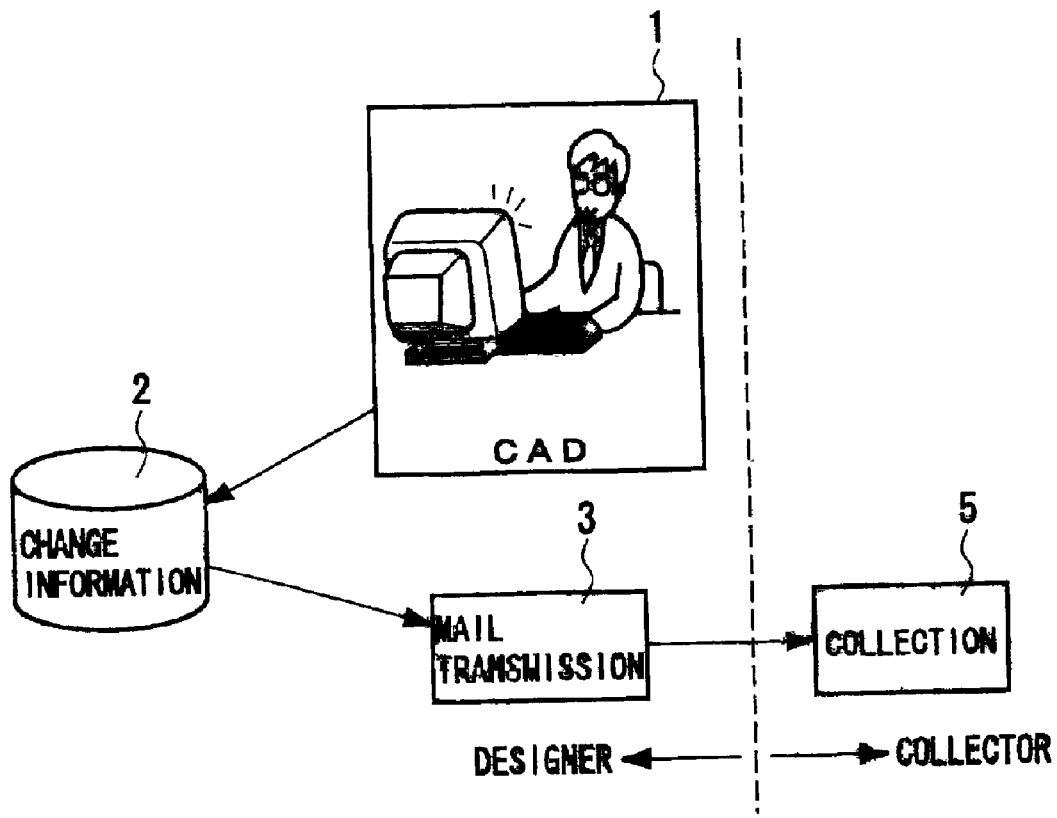
FIG. 1 is a block diagram showing the configuration of the present invention.
Figure 2:
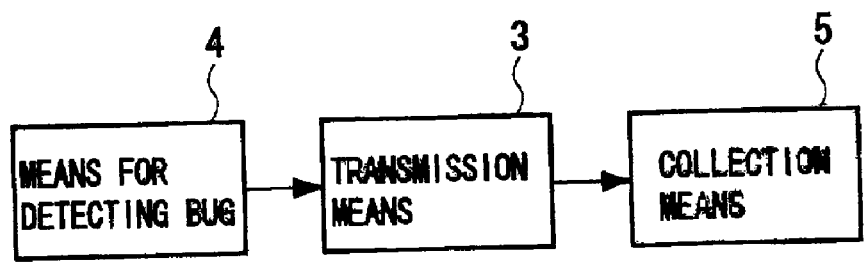
FIG. 2 is a functional block diagram showing the main parts of the present invention.
Figure 3:
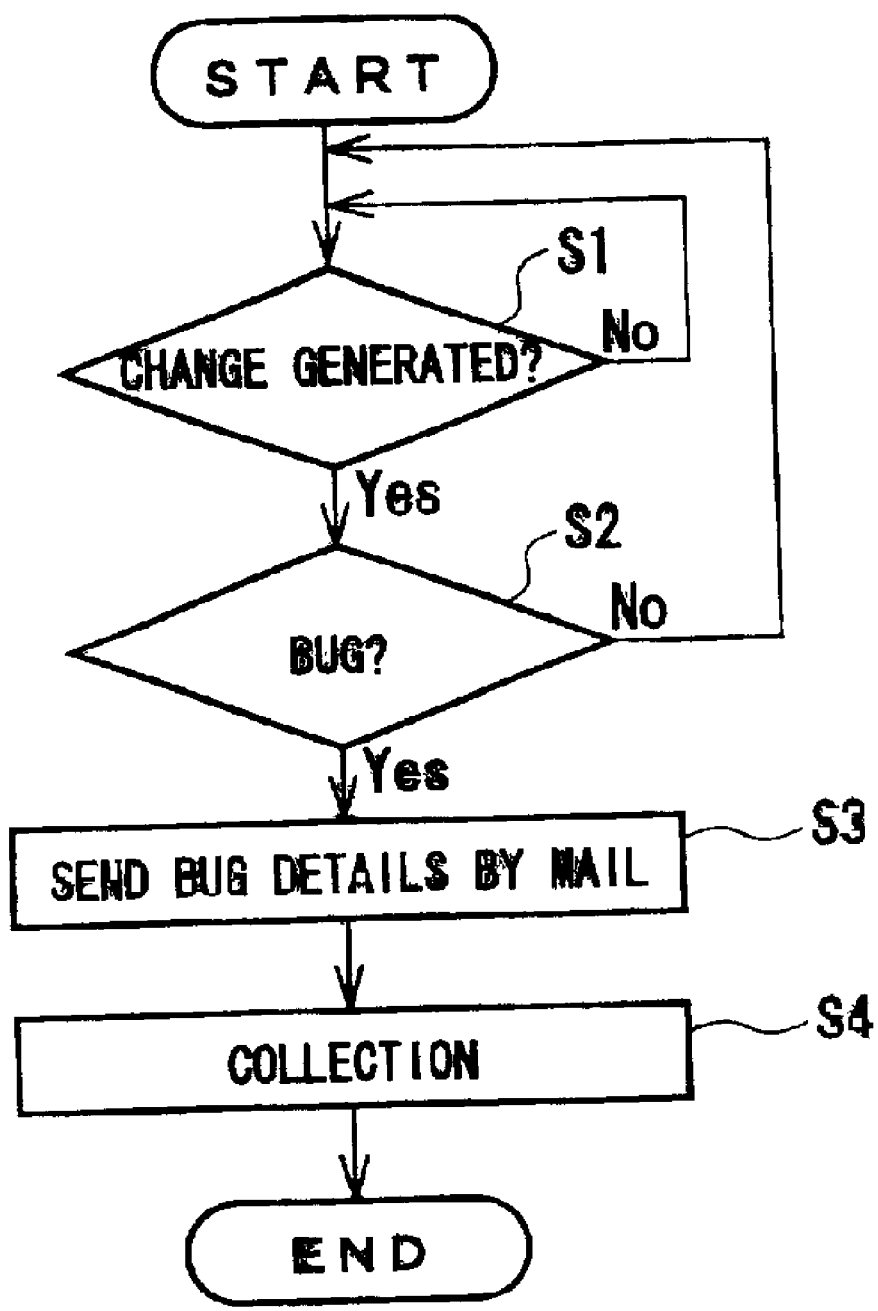
FIG. 3 is a flowchart showing the operation of the present invention.

FIG. 1 is block diagram showing the configuration of a problem part collection apparatus according to the present invention, FIG. 2 is a functional block diagram thereof, and FIG. 3 is a flowchart showing the operation of the present invention.

These drawings show a bug collection apparatus for use when a design modification is made to a problem part (hereinafter referred to as a bug) in a drawing designed by using a computer aided design system 1, the apparatus comprising: a first means (detection means) 4 for detecting whether the modification to the bug exceeds a pre-established criterion, and a second means (collection means) 5 for collecting and recording a bug information corresponding to the modification when the first means 4 detecting that the above modification exceeds the pre-established criterion.

The detection means 4 and the collection means 5 are provided separately one another, and the bug information detected by the detection means 4 is sent to the collection means 5 from the detection means 4.

Additionally, these drawings show a method for a bug collection for use when a design modification is made to a bug in a drawing designed by using a computer aided design system 1, this method comprising the steps of: detecting whether or not the modification to the bug exceeds a pre-established criterion, and collecting a bug information corresponding to the modification when an information including the modification exceeding the pre-established criterion is detected in the detecting step.

The present invention is described in further detail below.

Referring to FIG. 1, in the case in which a design modification is performed by using a CAD system 1, the content of that modification is written into the modification information file 2. If this information includes modification that exceeds a pre-established criterion, this modification will be regarded as the modification corresponding to a bug, so that this bug information will be sent to a collecting means 5 by means of a mail transmission 3, so that the bug information is collected to the collection means 5.

The present invention is described below in terms of the flowchart of FIG. 3.

Monitoring is performed to determine whether or not a modification operation is made at a CAD system 1, and if such a modification operation has been made (step S1), a judgment is made as to whether or not this modification exceeds a pre-established criterion (step S2). In this modification operation, the criterion for regarding a bug is, for example, in the case of a three-dimensional CAD system, the movement distance generated by the modification exceeds a given value, this criterion for bug detection being set beforehand. Then, if a bug is detected, the details of the bug information (for example, in the case of a three-dimensional CAD system, the operating command, the movement distance generated by the modification, or the operation time) are sent to the collection apparatus (step S3), this bug information being stored in a storage apparatus of the collection apparatus (step S4).

The change information 2 includes character information.

Additionally, it is possible to use any form of communication means, such as FTP transfer, as the data transfer means.

By adopting the configuration described in detail above, the present invention can perform automatic collection of design bug information. Furthermore, it features simple configuration and is easily implemented.

What is claimed is:

1. A bug collection apparatus for collecting bug information, said apparatus comprising:

means for detecting when a design modification is made to a bug in a drawing designed by using a computer aided design system;

first means for detecting whether said modification to said bug exceeds a pre-established criterion; and second means for collecting and recording a bug information corresponding to said modification when said first means detects that said modification exceeds said pre-established criterion.

2. A bug collection apparatus according to claim 1, wherein said information includes character information.

3. A bug collection apparatus according to claim 1, wherein said first means and said second means are provided separately from one another, said bug collection apparatus comprising a third means for sending said bug information from said first means to said second means.

4. The bug collection apparatus according to claim 1, wherein said first means automatically detects whether said modification exceeds said pre-established criterion.

5. The bug collection apparatus according to claim 1, wherein said first means instantaneously detects whether said modification exceeds said pre-established criterion.

6. The bug collection apparatus according to claim 1, wherein said first means detects whether each said modification exceeds said pre-established criterion.

7. The bug collection apparatus according to claim 1, wherein said second means automatically collects and records said bug information.

8. The bug collection apparatus according to claim 1, wherein said second means automatically collects and records said bug information for each said modification.

9. The bug collection apparatus according to claim 1, further comprising:

means for continuously detecting design modifications.

10. The bug collection apparatus according to claim 1, further comprising:

means for automatically detecting design modifications.

11. The bug collection apparatus according to claim 1, wherein said first means detects whether each modification to said bug exceeds a pre-established criterion.

12. The bug collection apparatus according to claim 1, wherein said first means detects whether a plurality of modifications to said bug exceeds pre-established criterion.

13. The bug collection apparatus according to claim 1, wherein said second means collects and records a bug information corresponding to each modification when said first means detects that said each modification exceeds said pre-established criterion.

14. The bug collection apparatus according to claim 1, wherein said second means collects and records a bug information corresponding to a plurality of modifications when said first means detects that said plurality of modifications exceeds said pre-established criterion.

15. A bug collection apparatus for collecting bug information, said apparatus comprising:

means for detecting when a design modification is made to a bug in a drawing designed by using a computer aided design system;

first means for detecting whether said modification to said bug exceeds a pre-established criterion;

second means, which is provided separately from said first means, for collecting and recording a bug information corresponding to said modification when said first means detects that said modification exceeds said pre-established criterion; and third means for sending said bug information from said first means to said second means.

16. A method for collecting bug information, said method comprising:

detecting whether a design modification is made to a bug in a drawing designed by using a computer aided design system;

detecting whether said modification to said bug exceeds a pre-established criterion; and collecting a bug information corresponding to said modification when an information including said modification exceeding said pre-established criterion is detected.

17. The bug collection method according to claim 16, wherein said detecting comprises automatically detecting whether said modification exceeds said pre-established criterion.

18. The bug collection method according to claim 16, wherein said detecting comprises instantaneously detecting whether said modification exceeds said pre-established criterion.

19. The bug collection method according to claim 16, wherein said detecting comprises detecting whether each said modification exceeds said re-established criterion.

20. The bug collection method according to claim 16, wherein said collecting comprises automatically collecting said bug information corresponding to said modification when said information including said modification exceeding said pre-established criterion is detected.

21. The bug collection method according to claim 16, wherein said collecting comprises automatically collecting said bug information corresponding to each said modification when said information including said modification exceeding said pre-established criterion is detected.

22. The bug collection method according to claim 16, further comprising continuously detecting design modifications.

23. The bug collection method according to claim 16, further comprising automatically detecting design modifications.

24. A method for collecting bug information, said method comprising:

detecting when a design modification is made to a bug in a drawing designed by using a computer aided design system;

detecting whether said modification to said bug exceeds a pre-established criterion;

sending a bug information corresponding to said modification to a collector, which is provided separately from a detector, for collecting and recording said bug information, when an information including said modification exceeding said pre-established criterion is detected; and collecting and recording said bug information sent to said collector.

25. A computer program for collecting bug information, said computer program causing a computer to execute a sequential method comprising:

detecting when a design modification is made to a bug in a drawing designed by using a computer aided design system;

detecting whether said modification to said bug exceeds a pre-established criterion; and collecting a bug information corresponding to said modification when an information including said modification exceeding said pre-established criterion is detected.

26. A computer program for collecting bug information, said computer program causing a computer to execute a sequential method comprising:

detecting when a design modification is made to a bug in a drawing designed by using a computer aided design system;

detecting whether said modification to said bug exceeds a pre-established criterion;

sending a bug information corresponding to said modification to a collector, which is provided separately from a detector, for collecting and recording said bug information, when an information including said modification exceeding said pre-established criterion is detected; and collecting and recording said bug information sent to said collector.

27. A bug collection apparatus for automatically collecting bug information when modifying a design using a computer aided design system, said apparatus comprising:

means for detecting whether a design modification is generated;

means for automatically determining whether said design modification exceeds a predetermined criterion; and means fur automatically collecting and recording a bug information corresponding to said modification when said modification exceeds said predetermined criterion.

28. The bug collection apparatus according to claim 27, wherein said means for automatically collecting and recording is provided separately from said means for detecting, and wherein said apparatus further comprises means for sending said bug information from said means for determining to said means for collecting and recording.

29. A method for automatically collecting bug information when modifying a design using a computer aided design system, said method comprising:

detecting a modification to said design;

determining whether said modification exceeds a predetermined criterion; and collecting a bug information corresponding to said modification when said modification exceeds said predetermined criterion.

30. The method according to claim 29, further comprising:

sending said bug information corresponding to said modification to a collector for collecting said bug information when said modification exceeds said predetermined criterion; and recording said bug information received by said collector.

31. A bug collection apparatus for automatically collecting bug information when modifying a design using a computer aided design system, said apparatus comprising:

a detector that detects whether a design modification is generated;

a determiner that automatically determines whether said design modification exceeds a predetermined criterion; and a collector that automatically collects and records a bug information corresponding to said modification when said modification exceeds said predetermined criterion.

32. The bug collection apparatus according to claim 31, wherein said determiner automatically determines, without human intervention, whether said design modification exceeds said predetermined criterion.

33. The bug collection apparatus according to claim 31, wherein said collector automatically collects and records, without human intervention, said bug information corresponding to said modification when said modification exceeds said predetermined criterion.

34. A bug collection apparatus for automatically collecting bug information when modifying a design using a computer aided design system, said apparatus comprising:

a detector that detects whether a design modification is generated;

a determiner that automatically determines, prior to an end of a design modification process, whether said design modification exceeds a predetermined criterion; and a collector that automatically collects and records a bug information corresponding to said modification when said modification exceeds said predetermined criterion.

35. The bug collection apparatus according to claim 34, wherein said determiner automatically determines, at a time of said design modification, whether said design modification exceeds a predetermined criterion.

36. The bug collection apparatus according to claim 34, wherein said determiner automatically determines, at a time when said design modification is made, whether said design modification exceeds a predetermined criterion.

* * * * *